(12) United States Patent  
Apalkov et al.

(10) Patent No.: US 7,486,552 B2
(45) Date of Patent: Feb. 3, 2009

(54) METHOD AND SYSTEM FOR PROVIDING A SPIN TRANSFER DEVICE WITH IMPROVED SWITCHING CHARACTERISTICS

(75) Inventors: Dmytro Apalkov, Milpitas, CA (US); Zhanjie Li, Santa Clara, CA (US)

(73) Assignee: Grandis, Inc., Milpitas, CA (US)

( * ) Notice: Subject to any disclaimer, the term of this patent is extended or adjusted under 35 U.S.C. 154(b) by 0 days.

(21) Appl. No.: 11/763,800

(22) Filed: Jun. 15, 2007

(65) Prior Publication Data

US 2008/0291721 A1  Nov. 27, 2008

Related U.S. Application Data

(60) Provisional application No. 60/939,329, filed on May 21, 2007.

(51) Int. Cl.
G11C 11/15 (2006.01)
(52) U.S. Cl. .................. 365/173; 365/158; 365/171
(58) Field of Classification Search ............. 365/158, 365/171, 173; 257/295
See application file for complete search history.

(56) References Cited

U.S. PATENT DOCUMENTS

| | | | |
|---|---|---|---|
| 5,459,701 A | 10/1995 | Tokita et al. | |
| 5,757,695 A | 5/1998 | Shi et al. | |
| 6,005,800 A | 12/1999 | Koch et al. | |
| 6,104,633 A | 8/2000 | Abraham et al. | |
| 6,114,719 A * | 9/2000 | Dill et al. | 257/295 |
| 6,205,053 B1 | 3/2001 | Anthony | |
| 6,798,691 B1 | 9/2004 | Ounadjela et al. | |
| 6,967,863 B2 * | 11/2005 | Huai | 365/158 |
| 7,106,624 B2 * | 9/2006 | Huai et al. | 365/171 |
| 2006/0132990 A1 | 6/2006 | Morise et al. | |

OTHER PUBLICATIONS

PCT International Search Report and Written Opinion of the International Searching Authority, issued Sep. 5, 2008, application No. PCT/US08/64794.

(Continued)

*Primary Examiner*—Gene N. Auduong
(74) *Attorney, Agent, or Firm*—Strategic Patent Group, P.C.

(57) ABSTRACT

A method and system for providing a magnetic element is described. The magnetic element includes a first pinned layer, a first spacer layer, a free layer, a second spacer layer, and a second pinned layer. The first and second pinned layers have first and magnetizations oriented in first and second directions, respectively. The first and second spacer layers are nonferromagnetic. The first and second spacer layers are between the free layer and the first and second pinned layers, respectively. The magnetic element is configured either to allow the free layer to be switched to each of multiple states when both a unidirectional write current is passed through the magnetic element and the magnetic element is subjected to a magnetic field corresponding to the each states or to allow the free layer to be switched to each of the plurality of states utilizing a write current and an additional magnetic field that is applied from at least one of the first pinned layer and the second pinned layer substantially only if the write current is also applied.

52 Claims, 8 Drawing Sheets

OTHER PUBLICATIONS

J.C. Slonczewski, Current-driven excitation of magnetic multilayers, Journal of Magnetism and Magnetic Materials 159 (1996) L1-L7.

L. Berger, Emission of spin waves by a magnetic multilayer traversed by a current, Physical Review B, vol. 54, No. 13, Oct. 1, 1996, pp. 9353-9358.

J.Z. Sun, Spin-current interaction with a monodomain magnetic body: A model study, Physical Review B, vol. 62, No. 12, Jul. 1, 2000, pp. 570-578.

Yiming Huai, et al., Observation of Spin-Transfer Switching in Deep Submicron-Sized and Low-Resistance Magnetic Tunnel Junction, Published on APL 84, 3118 (2004), pp. 1-13.

* cited by examiner

METHOD AND SYSTEM FOR PROVIDING A SPIN TRANSFER DEVICE WITH IMPROVED SWITCHING CHARACTERISTICS

CROSS-REFERENCE TO RELATED APPLICATIONS

The present application claims priority from co-pending provisional patent application Ser. No. 60/939,329 filed May 21, 2007 entitled "Method and System for Providing a Spin Transfer Device with Improved Switching Characteristics" and assigned to the assignee of the present application.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. Typically, a conventional magnetic element is used for storing data in such magnetic memories.

FIG. 1 depicts a conventional magnetic element 10, which may be a conventional magnetic tunneling junction (MTJ) or a conventional spin valve. The conventional magnetic element 10 may be used in a conventional magnetic memory. The conventional MTJ 10 typically resides on a substrate (not shown), uses seed layer(s) 11 and includes a conventional antiferromagnetic (AFM) layer 12, a conventional pinned layer 14, a conventional barrier layer 16, a conventional free layer 18, and a conventional capping layer 20. The conventional pinned layer 14 and the conventional free layer 18 are ferromagnetic. Typically, materials containing Fe, Ni, and/or Co such as FeCo, FeCoB, Permalloy, Co, are used in the conventional pinned layer 14 and the conventional free layer 18. The conventional free layer 18 has a changeable magnetization 19 and may have an easy axis established by a shape anisotropy. The easy axis of the conventional free layer 18 is typically such that the free layer magnetization 19 is parallel (P state) or antiparallel (AP state) with the magnetization 15 of the conventional pinned layer 14. The magnetization 15 of the conventional pinned layer 14 is fixed, or pinned, in a particular direction, typically by an exchange-bias interaction with the AFM layer 12. Although depicted as simple (single) layers, the pinned layer 14 and free layer 18 may include multiple layers. For example, the pinned layer 14 and/or the free layer 18 may be a synthetic layer including ferromagnetic layers antiferromagnetically or ferromagnetically coupled through a thin conductive layer, such as Ru. In such a synthetic layer, multiple layers of CoFeB interleaved with a thin layer of Ru may be used for the conventional pinned layer 14 and/or the conventional free layer 18. Further, other versions of the conventional magnetic element 10 might include an additional pinned layer (not shown) separated from the free layer 18 by an additional nonmagnetic barrier or conductive layer (not shown).

Data, such as a logical "1" or "0", typically corresponds to the magnetization 19 of the free layer 18 being in the P state or the AP state, respectively. Thus, data are written by setting the free layer 18 in the P state or the AP state. For some conventional magnetic elements 10, this is accomplished by applying an external magnetic field, for example using one or more current-carrying lines (not shown). In other conventional magnetic elements 10 this is accomplished using the spin transfer effect. Reading the state of the conventional free layer 18, and thus the conventional magnetic element 10, is done by measuring the resistance of the conventional magnetic element 10, typically by driving a read current through the conventional magnetic element 10.

To change the magnetization state of the free layer 18 using the spin transfer effect, a current is driven in a current-perpendicular to the plane (CPP) direction (i.e. the z direction in FIG. 1) through the conventional magnetic element 10 having a small enough size. For spin transfer based switching to become important in switching the magnetization state of the conventional magnetic element 10, the lateral dimensions of the magnetic element 10 may be small, for example in the range of a few hundred nanometers or less, in order to facilitate current-based switching through the spin transfer effect.

The write current used in switching the conventional magnetic element 10 via spin transfer is typically a bidirectional write current. For a bidirectional write current, a write current is applied one way (from the conventional pinned layer 14 to the conventional free layer 18) to switch the conventional magnetic element 10 to the AP state, while the write current is applied in the opposite direction to switch the conventional magnetic element 10 to the P state. Note that these write currents may have different magnitudes. When electrons travel through the conventional pinned layer 14, they become spin-polarized, with electron spins preferentially pointing along the magnetization 15 of the conventional pinned layer 14. For current driven from the conventional free layer 18 to the conventional pinned layer 14, the electrons polarized by the conventional pinned layer 14 enter the free layer 18 and exert a torque on the magnetization 19, which can cause generation of spin waves or even complete switching of the magnetization 19 to the P state. When switching to the AP state, electrons having their spins aligned antiparallel to the magnetization 15 of the conventional pinned layer 14 are more likely to reflect back to the conventional free layer 18. These electrons may exert a torque on the magnetization 19 and may cause generation of spin waves or complete switching of the magnetization 19 to the AP state.

A measure of the current density in the device for observing the switching is given by on-axis magnetization instability current density. For a monodomain small particle under the influence of spin transfer torque, this instability current density, or critical switching current may be given by:

$$J_{c0} = \frac{2e\alpha M_S t_F \left(H + H_K + \frac{H_d}{2}\right)}{\hbar \eta},$$

where e is electron charge, $\alpha$ is the Gilbert damping constant, $M_S$ is the saturation magnetization, $t_F$ is the thickness of the free layer, H is the applied field, $H_K$ is the effective uniaxial anisotropy of the free layer (including shape and intrinsic anisotropy contributions), Hd is the out-of-plane demagnetizing field (typically equal to $4\pi M_s$ for a thin ferromagnetic film), h is the reduced Planck's constant, and $\eta$ is the spin transfer efficiency related to polarization factor of the incident current. At this current density the initial position of the free layer magnetization 19 along the easy axis becomes unstable and it starts precessing around the easy axis. As the current is increased further, the amplitude of this precession increases until the magnetic element 10 is switched into the other state. For fast switching of the free layer magnetization 19, in nanosecond regime, the required current is several times greater than the instability current $J_{c0}$.

Although the bidirectional write current can switch the magnetization 19 of the conventional free layer, its use may have drawbacks. For example, significant limitations may be imposed on the maximum allowed switching current to be passed through the conventional magnetic element 10. In particular, when used in a memory, the conventional magnetic element 10 is used in conjunction with a selection transistor. The bidirectional current is limited by the size of the selection transistor (not shown). Several techniques and material optimization have been performed to decrease this current. However, further improvements are still desired.

Accordingly, what is needed is a method and system that may improve performance of the conventional magnetic element 10 when current-based switching is employed. The method and system address such a need.

BRIEF SUMMARY OF THE INVENTION

A method and system for providing a magnetic element is described. The magnetic element includes a first pinned layer, a first spacer layer, a free layer, a second spacer layer, and a second pinned layer. The first and second pinned layers have first and second magnetizations oriented in first and second directions, respectively. The first and second spacer layers are nonferromagnetic. The first and second spacer layers are between the free layer the first and second pinned layers, respectively. At least one of the magnetic element is configured to allow the free layer to be switched to each of a plurality of states when both a unidirectional write current is passed through the magnetic element and the magnetic element is subjected to a magnetic field corresponding to the each of the plurality of states and the magnetic element is configured to allow the free layer to be switched to each of the plurality of states utilizing a write current and an additional magnetic field that is applied from at least one of the first pinned layer and the second pinned layer substantially only if the write current is also applied.

According to the method and system disclosed herein, a magnetic element capable of being written using a unidirectional write current may be achieved.

DETAILED DESCRIPTION OF THE INVENTION

Figure 1:
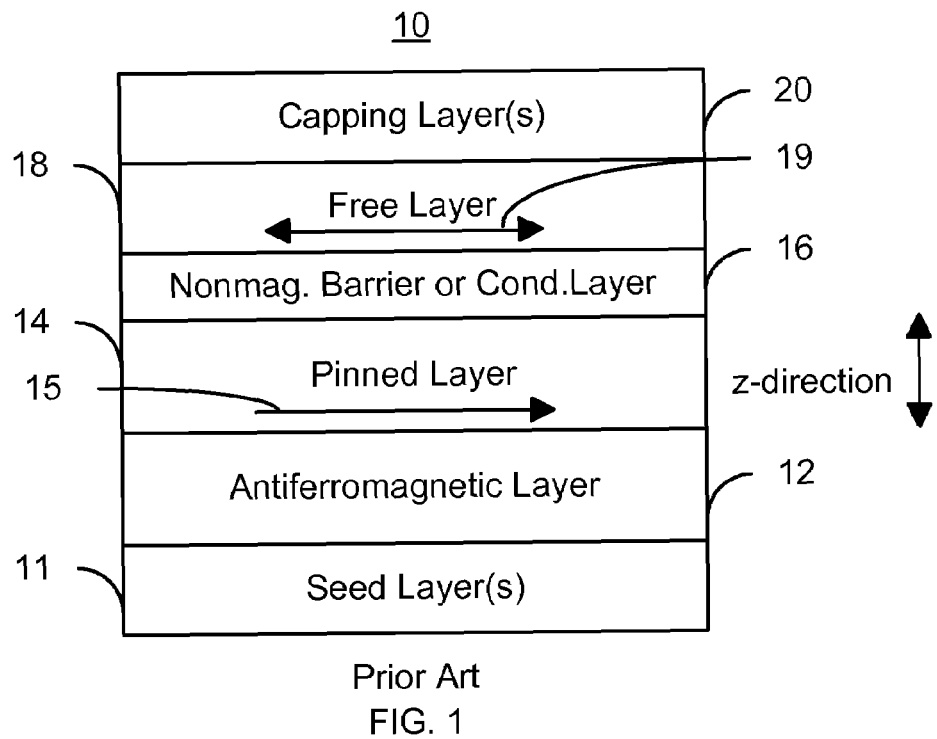
FIG. 1 is a diagram of a conventional magnetic element.

The method and system relate to magnetic memories. The following description is presented to enable one of ordinary skill in the art to make and use the method and system and is provided in the context of a patent application and its requirements. Various modifications to the embodiments and the generic principles and features described herein will be readily apparent to those skilled in the art. Thus, the method and system are not intended to be limited to the embodiments shown, but is to be accorded the widest scope consistent with the principles and features described herein.

A method and system for providing a magnetic element is described. The magnetic element includes a first pinned layer, a first spacer layer, a free layer, a second spacer layer, and a second pinned layer. The first and second pinned layers have first and second magnetizations oriented in first and second directions, respectively. The first and second spacer layers are nonferromagnetic. The first and second spacer layers are between the free layer and the first and second pinned layers, respectively. At least one of the magnetic element is configured to allow the free layer to be switched to each of a plurality of states when both a unidirectional write current is passed through the magnetic element and the magnetic element is subjected to a magnetic field corresponding to the each of the plurality of states and the magnetic element is configured to allow the free layer to be switched to each of the plurality of states utilizing a write current and an additional magnetic field that is applied from at least one of the first pinned layer and the second pinned layer substantially only if the write current is also applied.

The method and system are described in the context of particular magnetic elements and magnetic memories having certain components. One of ordinary skill in the art will readily recognize that the present invention is consistent with the use of magnetic elements and magnetic memories having other and/or additional components. The method and system will also be described in terms of a particular magnetic element having certain components. However, one of ordinary skill in the art will readily recognize that this method and system will operate effectively for other magnetic memory elements having different and/or additional components and/or other magnetic memories having different and/or other features not inconsistent with the present invention. The method and system are also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic elements having particular layers. However, one of ordinary skill in the art will readily recognize that magnetic elements having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single elements. However, one of ordinary skill in the art will readily recognize that the method and system are consistent with the use of magnetic memories having multiple elements, bit lines, and word lines.

The method and system are also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. For example, as depicted in the drawings, the bottoms of the structures are typically closer to an underlying substrate than the tops of the structures. However, one of ordinary skill in the art will readily recognize that the method and system are consistent with other structures having different relationships to the substrate. In addition, the method and system are described in the context of certain layers being synthetic and/or simple. However, one of ordinary skill in the art will readily recognize that the layers could have another structure. Furthermore, the present invention is described in the context of magnetic elements having particular layers. However, one of ordinary skill in the art will readily recognize that magnetic elements having additional and/or different layers not inconsistent with the present invention could also be used.

Figure 2:
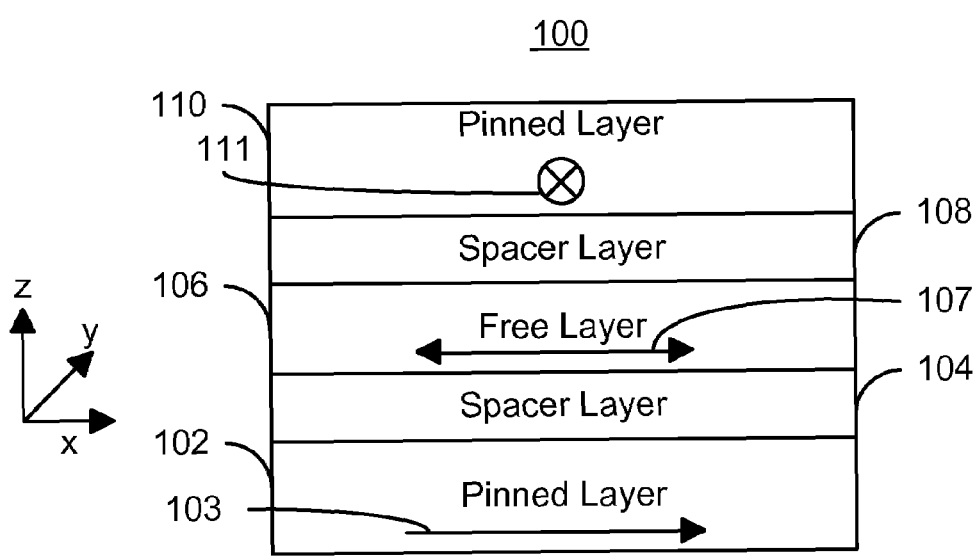
FIG. 2 is a diagram depicting an exemplary embodiment of a magnetic element having improved switching characteristics.

To more particularly describe the method and system, refer to FIG. 2, depicting an exemplary embodiment of a magnetic element 100 that may have improved switching characteristics. The magnetic element 100 includes at least a first pinned layer 102, a first spacer layer 104, a free layer 106, a second spacer layer 108, and a second pinned layer 110. The pinned layers 102 and 110 have their magnetizations 103 and 111, respectively, pinned in place by pinning layers (not shown), such as AFM layers (not shown). However, in another embodiment, the AFM layer may be omitted and another mechanism used to pin the magnetizations 103 and 111 of the pinned layers 102 and 110, respectively. Although depicted as simple layers, the pinned layers 102 and 110 may include multiple layers. For example, the pinned layer 102 and/or the 110 may be a synthetic layer including ferromagnetic layers antiferromagnetically coupled through a thin conductive layer, such as Ru. In addition, seed layer(s) (not shown) and capping layer(s) (not shown) are also generally used.

The spacer layers 104 and 108 are nonmagnetic. In one embodiment, one or both of the spacer layers 104 and 108 are conductive. One or both of the spacer layers 104 and 108 may be a barrier layer, for example an insulating tunneling barrier layer. Alternatively, one or both of the spacer layer 104 and 108 may have another structure, for example a granular layer including conductive channels in an insulating matrix. However, in a preferred embodiment, the spacer layers 104 and 108 are both insulating tunneling barrier layers.

The free layer 106 is ferromagnetic and includes at least one of Co, Ni, and Fe. Although depicted as a simple layer, the free layer may be a synthetic layer including multiple (e.g. two) ferromagnetic layers separated by a nonmagnetic spacer layer, such as Ru. The equilibrium position of the magnetization 107 of the free layer 106 is along the easy axis (not separately shown in FIG. 2). Thus, the equilibrium position of the magnetization 107 is preferably substantially parallel or antiparallel to the magnetization 103 of the pinned layer 102.

The magnetizations 103 and 111 of the pinned layers are oriented substantially perpendicular. In the embodiment shown, the magnetizations 103 and 111 are both in plane (in the plane of the layers 102, 104, 106, 108, and 110). However, in another embodiment, the magnetization 111 may be substantially normal to the plane of the layers. The magnetic element 100 is configured such that at least one of: (1) the magnetization 107 of the free layer 106 to be switched to each of a plurality of states when both a unidirectional write current is passed through the magnetic element and the magnetic element is subjected to a magnetic field corresponding to the each of the plurality of states and (2) the magnetization 107 of the free layer 106 to be switched to each of the plurality of states utilizing a write current and an additional magnetic field that is applied from at least one of the pinned layers 102 and 110 substantially only if the write current is also applied.

Thus, in one embodiment, the magnetic element 100 is written using a unidirectional current and a magnetic field. The magnetic field used may be bidirectional and is used to select which of the states the magnetic element 100 is to be written to. In another embodiment, the magnetic element 100 may be written using a write current that may be bidirectional and a magnetic field that may be supplied by one of the pinned layers 102 and 110. In another embodiment, a combination of the two may be used. For example, a pinned layer, such as the pinned layer 110 may generate a magneto field during switching and a unidirectional current may be applied. The magnetic field generated by the pinned layer 110 may be seen as decreasing the thermal stability of the magnetic element 100, thus aiding in switching. Consequently, although described below separately, features of the magnetic elements described herein might be used separately or combined.

Figure 3:
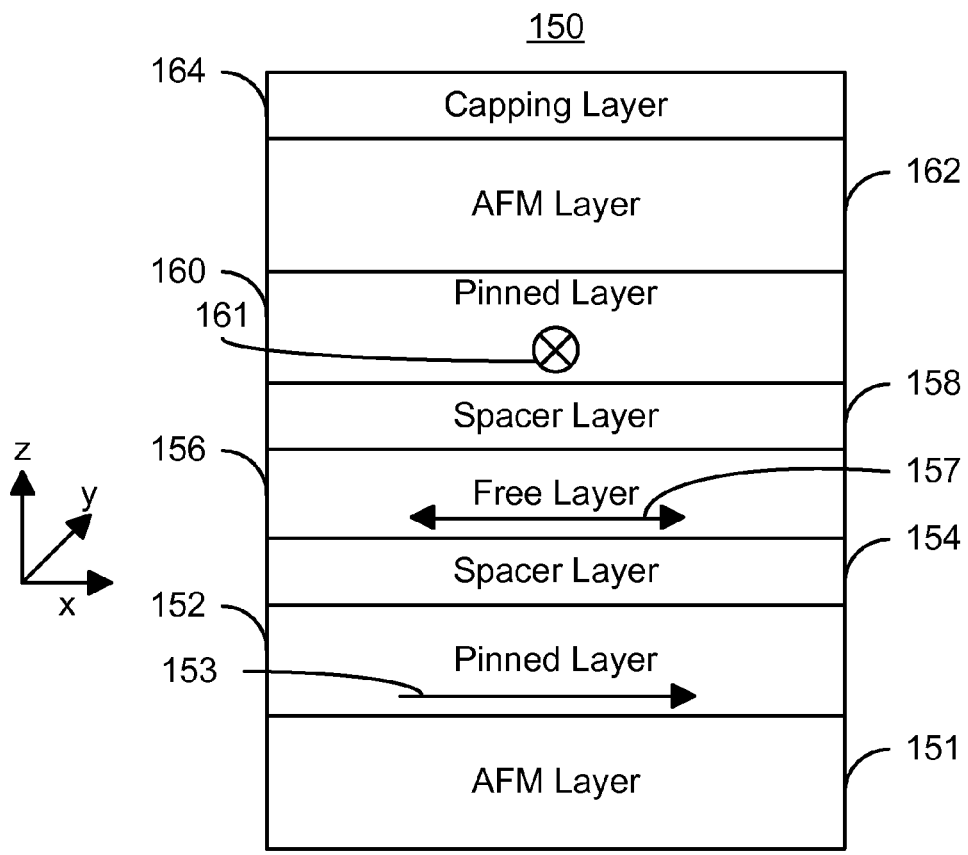
FIG. 3 is a diagram depicting an exemplary embodiment of a magnetic element switchable with a unidirectional current.

Thus, in one embodiment, the magnetic element 100 is configured such that current in the same direction is applied for all states to which the magnetic element 100 is switched. Such an embodiment of the magnetic element 100 is described in the context of the magnetic element 150 shown in FIG. 3. FIG. 3 is a diagram depicting an exemplary embodiment of a magnetic element 150 switchable with a unidirectional current. The magnetic element 150 includes first pinned layer 152, first spacer layer 154, free layer 156, second spacer layer 158, and second pinned layer 160 that correspond to the layers 102, 104, 106, 108, and 110, respectively of the magnetic element 100 of FIG. 2. Referring back to FIG. 3, also shown are AFM layers 151 and 162 that act as pinning layers for the pinned layers 152 and 160, respectively. In addition, capping layer 164 is also depicted. The magnetic element 150 may also include seed layer(s) (not shown) under the magnetic AFM layer 151 and residing on an underlying substrate (not shown).

Although AFM layers 151 and 162 are shown, the AFM layers may be omitted and another mechanism used to pin the magnetizations 153 and 161 of the pinned layers 152 and 160, respectively. Although depicted as simple layers, the pinned layers 152 and 160 may include multiple layers. For example, the pinned layer 152 and/or the 160 may be a synthetic layer including ferromagnetic layers antiferromagnetically coupled through a thin conductive layer, such as Ru. In addition, seed layer(s) (not shown) and capping layer(s) (not shown) are also generally used.

The spacer layers 154 and 158 are nonmagnetic. In one embodiment, one or both of the spacer layers 154 and 158 are conductive. One or both of the spacer layers 154 and 158 may be a barrier layer, for example an insulating tunneling barrier layer. Alternatively, one or both of the spacer layer 154 and 158 may have another structure, for example a granular layer including conductive channels in an insulating matrix. However, in a preferred embodiment, the spacer layers 154 and 158 are both insulating tunneling barrier layers.

The free layer 156 is ferromagnetic and includes at least one of Co, Ni, and Fe. Although depicted as a simple layer, the free layer 156 may be a synthetic layer including multiple (e.g. two) ferromagnetic layers separated by a nonmagnetic spacer layer, such as Ru. The equilibrium position of the magnetization 157 of the free layer 156 is along the easy axis (not separately shown in FIG. 3). Thus, the equilibrium position of the magnetization 157 is preferably substantially parallel or antiparallel to the magnetization 153 of the pinned layer 152.

Figure 4:
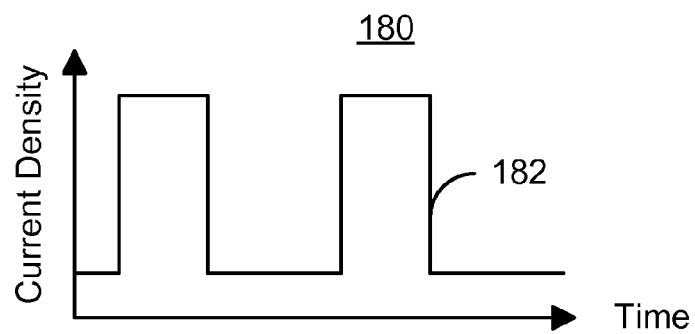
FIG. 4 is a diagram depicting the current and field during switching in an exemplary embodiment of a magnetic element switchable with a unidirectional current.
Figure 4:
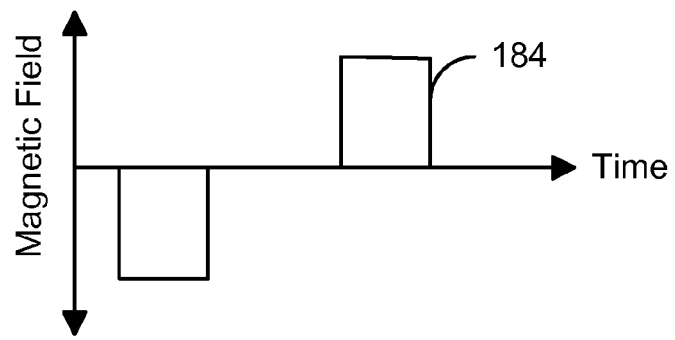

In operation, a unidirectional current is used in conjunction with a bidirectional field to switch the state of the magnetic element 150. FIG. 4 depicts graphs 180 of the current density 182 through the magnetic element 150 and the bidirectional field 184 used to switch the magnetic element 150 to different states. Referring to FIGS. 3 and 4, a combination of spin transfer and an applied filed is used. In the embodiment shown, the spin transfer torque generated from the unidirectional write current is not used to select the state (e.g. AP or P) to which the free layer 156 is switched. Instead, a magnetic field is applied in addition to the unidirectional current. The direction of the magnetic field determines the direction of the magnetization 157 of the free layer 156—parallel or antiparallel to the magnetization 153 of the pinned layer 152. In such an embodiment, to write to the magnetic element 150, a unidirectional current is applied through the magnetic element 150 along z direction and a bidirectional field is applied along the easy axis (positive or negative x axis).

The thermal stability determines how easily the magnetization 157 of the free layer 156 is switched between two stable states (high and low resistance states-AP and P). The thermal stability is characterized by thermal stability factor, $$\Delta = \frac{E_B}{k_B T},$$

where $k_B$ is Boltzmann constant, $E_B$ is the energy barrier separating two stable states, and T is the operating temperature. Thermal stability characterizes the stability of a system, such as the magnetic element 150, against thermal fluctuations. In order to achieve the data retention over long period of time (e.g. on the order of ten years) the thermal stability factor is desired to be at least approximately forty. However, thermal stability is also related to switching. The higher the thermal stability factor, the higher the write current or magnetic field required to switch the free layer magnetization 157. Consequently, a reduction of the thermal stability factor may facilitate switching of the magnetic element 150.

The unidirectional current is primarily utilized to decrease the thermal stability factor of the free layer 156. In the magnetic element 150, a decrease of the thermal stability factor might be achieved in a number of ways. First, a write current may rotate the magnetization 157 of the free layer 156 toward the in-plane hard axis (y) due to spin transfer torque, thereby decreasing the thermal stability. Second, the in homogeneity of the system may be increased by the Oersted field generated by the current. The magnetic field decreases the effective switching volume and makes the system easier to switch when a write current is applied. Third, joule heating by the write current passing through the free layer 156 may decrease the thermal stability. This effect may be particularly large for dual structures if two AFM layers act as pinning layers. Such AFM layers typically have poor thermal conductivity and thus act as thermal barriers that increase free layer temperature and decrease thermal stability factor.

In an embodiment which utilizes a unidirectional write current, such as the magnetic element 150, the thermal stability factor may be decreased by a torque due to spin transfer from the unidirectional write current. The unidirectional write current may also give rise to joule heating, which also decreases the thermal stability of the magnetic element 150. Note that in one preferred embodiment, the spin transfer torque from the layer 152 is small to reduce or prevent asymmetric behavior of the magnetic element 150. Stated differently, the magnetic element 150 may not exhibit a preference to switch to one of the states. This may be achieved by separate optimization of the two spacer layers 154 and 158. Determination of the final state (P/AP) and thus the direction of the magnetization 157 of the free layer 156 is accomplished by applying a magnetic field along the easy axis. Because the thermal stability factor is suppressed by the unidirectional current, a relatively small easy axis field may be used to select the final state of the system. For example, in one embodiment, the applied field divided by the anisotropy field may be approximately 0.1-0.8 and the current density may be on the order of $10^5$-$10^8$, or even in the range of $10^5$-$10^6$. After the unidirectional current and magnetic field are turned off, the magnetic element 150 remains in the switched state. Consequently, the magnetic element 150 may be written.

Figure 5:
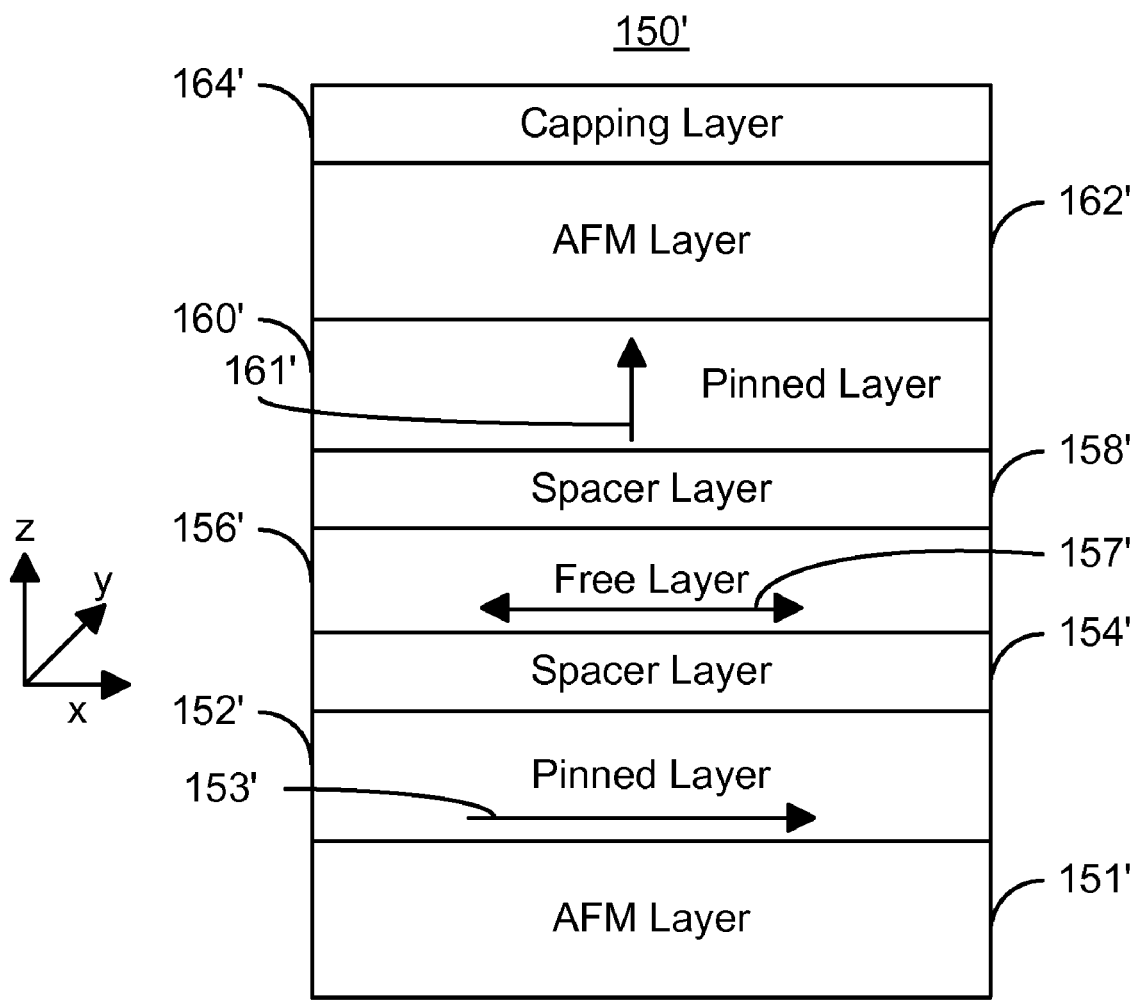
FIG. 5 is a diagram depicting another exemplary embodiment of a magnetic element switchable with a unidirectional current.

FIG. 5 is a diagram depicting another exemplary embodiment of a magnetic element 150' switchable with a unidirectional current. The magnetic element 150' is analogous to the magnetic element 150. Consequently, the magnetic element 150' includes similar components having analogous labels. Consequently, pinned layer 152' and 160', spacer layers 154' and 158' that are preferably tunneling barrier layers, pinned layers 152' and 160', pinning layers 151' and 162' are shown. The pinned layers 152' and 160' and the free layer 156' may be single ferromagnetic layers or synthetic structures. In addition, the magnetic element 150' is configured to be written in a manner analogous to the magnetic element 150. Thus, for example, the graphs 180 of the current density 182 and the bidirectional field 184 depicted in FIG. 4 may also apply to the magnetic element 150' of FIG. 5.

However, instead of being in the plane of the layers, the magnetization 161' of the pinned layer 160' is perpendicular to the plane. Not only are the magnetizations 161' and 153' perpendicular, but the magnetization 161' is also substantially normal to the plane of the layers of the magnetic element 150'. This perpendicular pinning may be achieved in various ways. For example, the ferromagnetic material(s) used for the pinned layer 160' may have a strong out-of-plane anisotropy. Examples of such materials include FePt, CoPt, FePd, CoPd. The pinning perpendicular to the plane may also be achieved through an exchange bias with the second antiferromagnetic layer 162' on the second pinned layer 160'.

The magnetic element 150' is thus configured to be written using a combination of a unidirectional write current that provides a spin transfer induced torque and a magnetic field.

The magnetic field may be applied along the easy axis (not separately shown) for the free layer 156'. The unidirectional current is used to decrease thermal stability factor and bidirectional easy-axis field is used to switch the magnetization 157' of the free layer 156'. Thus, operation of the magnetic element 150' is analogous to the magnetic element 150.

Figure 6:
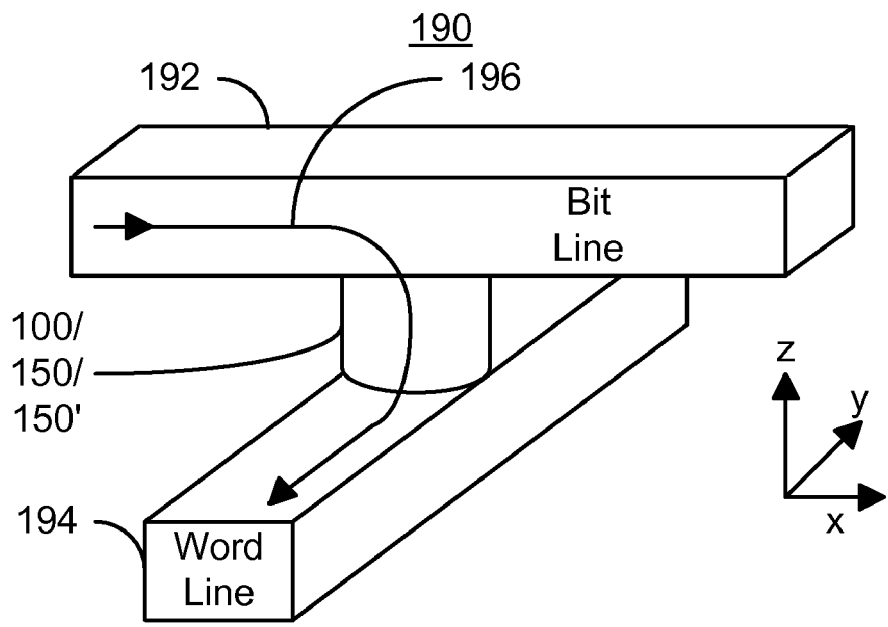
FIG. 6 is a diagram depicting another exemplary embodiment of a magnetic element used in a memory and switchable with a unidirectional current.
Figure 7:
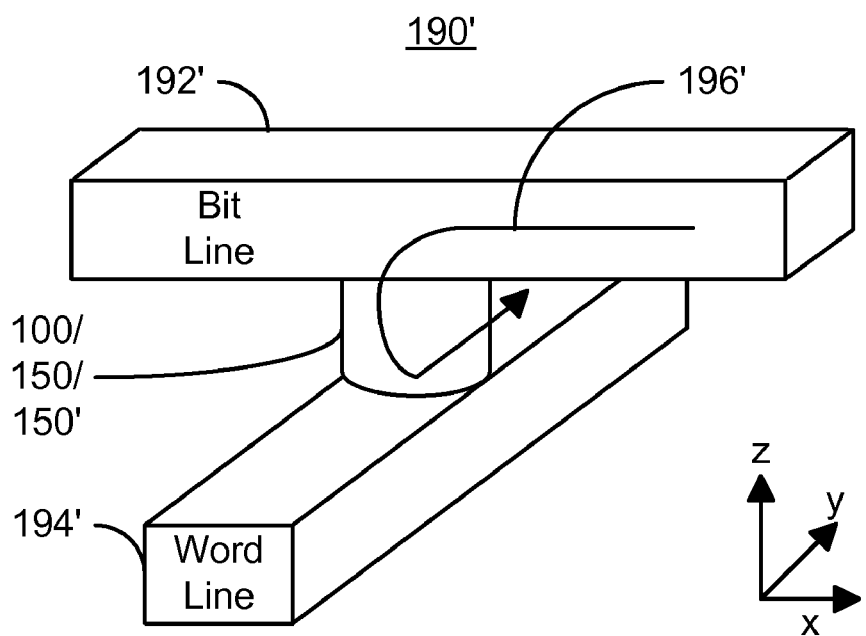
FIG. 7 is a diagram depicting another exemplary embodiment of a magnetic element used in a memory and switchable with a unidirectional current.
Figure 8:
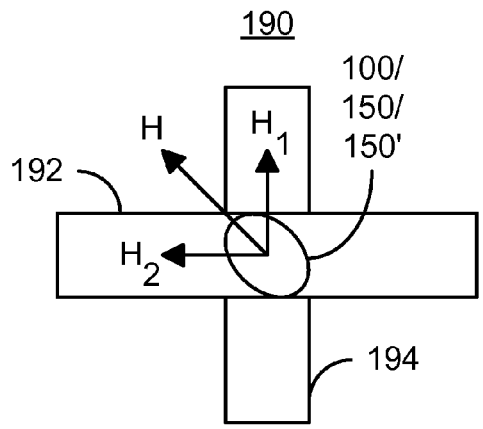
FIG. 8 is a diagram depicting another exemplary embodiment of a magnetic element switchable with a unidirectional current.
Figure 9:
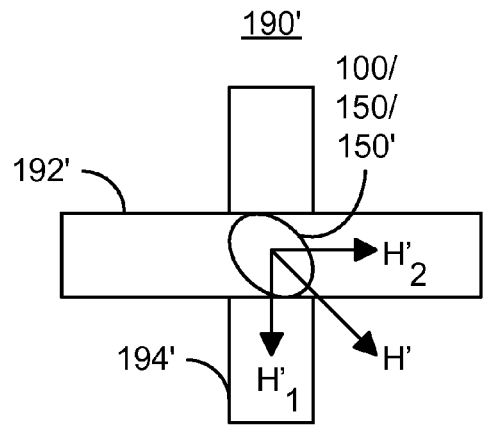
FIG. 9 is a diagram depicting another exemplary embodiment of a magnetic element switchable with a unidirectional current.

The unidirectional current in conjunction with a bidirectional field may be applied to the magnetic elements 100/150/150' in a number of ways. In one embodiment, the magnetic field may be applied using different current line(s) than for the unidirectional current. However, in another embodiment, the same lines may be used for carrying the unidirectional current and generating the magnetic field. FIGS. 6-9 depict an embodiment 190/190' of such a system. The memory 190/190' includes bit line 192/192' and word line 194/194'. For simplicity, other components that might be included, such as selection transistor(s) are not shown. FIGS. 6 and 8 depict the memory 190 when the magnetic element 100/150/150' is written to a first state, while FIGS. 7 and 9 depict the magnetic memory 190' when the magnetic element 100/150/150' is written to a second state. Thus, the memory 190 depicts the magnetic element 100/150/150' when the applied field is in a first direction and the magnetic element 100/150/150' is to be switched to a first state. Similarly, the memory 190' depicts the magnetic element 100/150/150' when the applied field is in a second direction and the magnetic element 100/150/150' is to be switched to a second state.

When writing to the first state, current is driven through the bit line 192 in the x direction and through the word line 194 in the −y direction. The current through the bit line 192 and the word line 194 result in magnetic fields $H_1$ and $H_2$, respectively. Consequently, the resultant field, H, is shown in FIG. 8, is along the easy axis of the free layer 106/156/156' and defined by the shape anisotropy of the magnetic element. When writing to the second state, current is driven through the bit line 192' in the −x direction and through the word line 194' in the y direction. The current through the bit line 192' and the word line 194' result in magnetic fields $H_1$ and $H_2$, respectively. Consequently, the resultant field, H', shown in FIG. 9, is along the easy axis of the free layer 106/156/156' and is opposite to the magnetic field in FIGS. 6 and 8. Consequently, the magnetic element 100/150/150' may be written to.

Thus, the switching of the magnetic element 100/150/150' utilizing a unidirectional write current in combination with a bidirectional field may be achieved. Use of a unidirectional switching current may improve the switching characteristics of the magnetic element 100/150/150'. Because the unidirectional current is used to destabilize the magnetization 157/157' of the free layer 156/156', a smaller current may be used. Thus, the strict requirements on the maximum value of the current passed through the magnetic element 150/150' due to a selection transistor may be alleviated. In addition, cancellation of the tunneling magnetoresistance during reading may be reduced over a to conventional dual structure with antiparallel orientation of pinned layer magnetizations. The magnetization 161/161' of the pinned layer 160/160' is substantially perpendicular to the easy axis of the free layer 156/156'. Consequently, the contribution of the pinned layer 160/160' to the magnetoresistance of the magnetic element 150/150' is substantially constant. As a result, the magnetoresistance of the magnetic element 150/150' may be improved over a conventional dual magnetic element. This results in increase of the resultant signal in the new structure.

Figure 10:
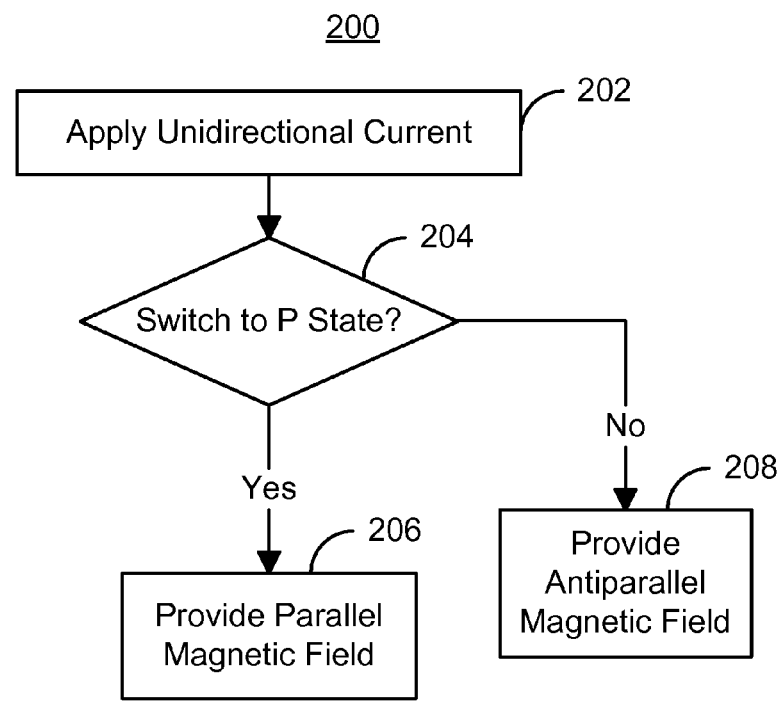
FIG. 10 is a diagram depicting an exemplary embodiment of a method for switching magnetic element.

FIG. 10 is a diagram depicting an exemplary embodiment of a method 200 for switching magnetic element 100/150/150' when the unidirectional current is used. For clarity, the method 200 is described in the context of the magnetic element 150. However, the method 200 may be used with other structures. A unidirectional current is applied to the magnetic element 150, via step 202. Because the spin transfer due to the unidirectional current is only used to destabilize the magnetization 157 of the free layer 156, a smaller current may be applied in step 202. It is determined whether the magnetic element 150 is to be switched to the P state, via step 204. If so, then the magnetic field in the direction of the magnetization 153 is applied, via step 206. Step 206 may be accomplished by applying a magnetic field using a separate current from the unidirectional current. Alternatively, the magnetic field applied in step 206 may be provided using the unidirectional current, as depicted in FIGS. 6 and 8. If the magnetic element 150 is not to be switched to the parallel state, then the magnetic element 150 is switched to the antiparallel state. This is accomplished by providing a magnetic field antiparallel to the magnetization 153, via step 208. Step 208 may be accomplished by applying a magnetic field using a separate current from the unidirectional current. Alternatively, the magnetic field applied in step 206 may be provided using the unidirectional current, as depicted in FIGS. 7 and 9. Thus, the magnetic element 150 may be written. Because a lower unidirectional current is used, the strict requirements on the maximum value of the current passed through the magnetic element 150 may be alleviated. In addition, cancellation of the tunneling magnetoresistance during reading may be reduced, as compared to conventional dual structure, which has pinned layers with opposite directions of the magnetization. Thus, the method may provide improved switching and a higher signal.

Figure 11:
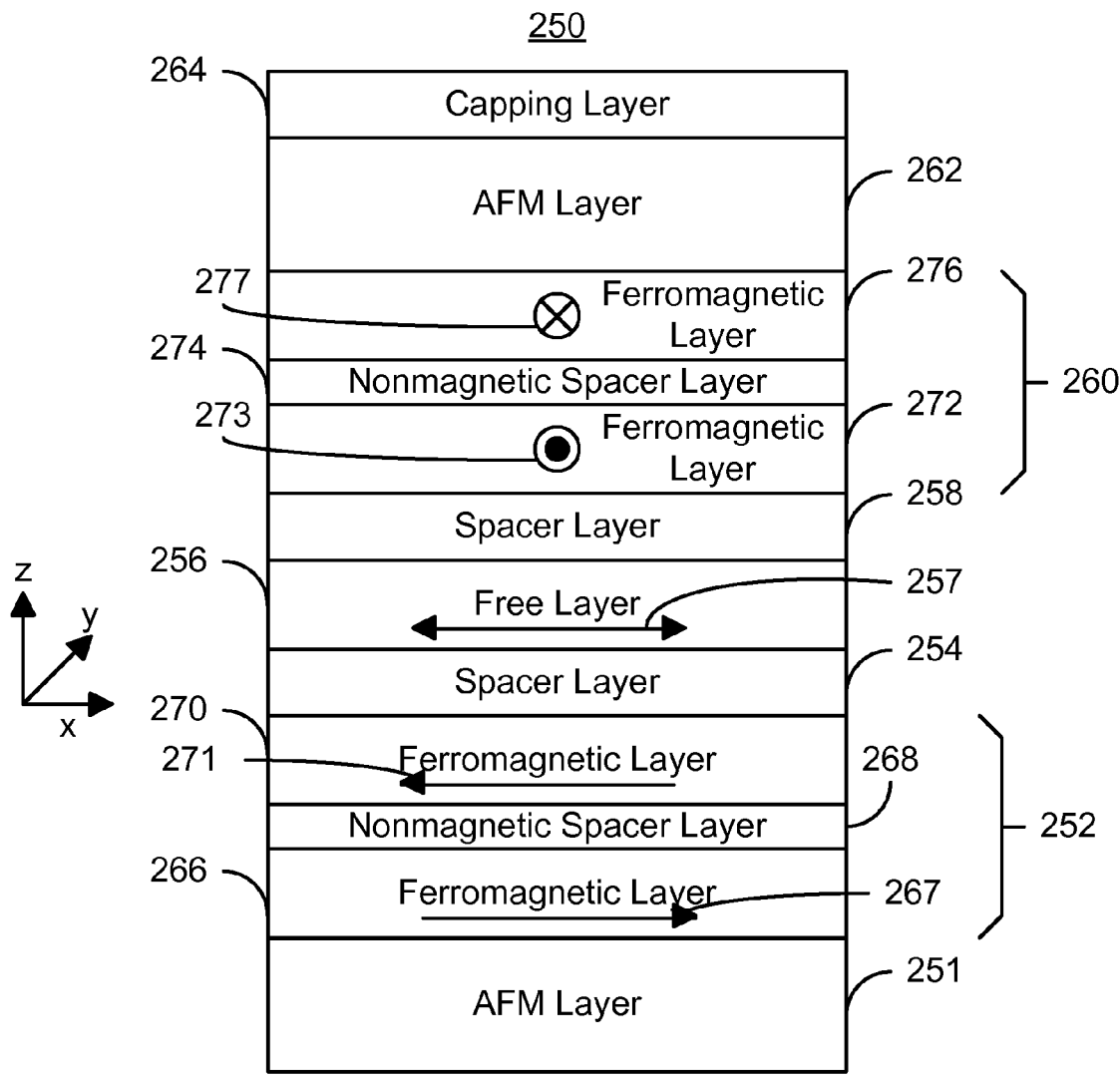
FIG. 11 is a diagram depicting an exemplary embodiment of a magnetic element switchable using a current with a magnetic field generated by the magnetic element assisting the switching.

As described above, the magnetic element 100 may also be configured such that the magnetization 107 of the free layer 106 is switched to each of the plurality of states utilizing a write current and an additional magnetic field that is applied from at least one of the pinned layers 102 and 110 substantially only if the write current is also applied. In one such embodiment, one or more of the pinned layers 102 and 110 only applies a magnetic field if the write current is also applied. Also in such an embodiment, the magnetic field is preferably a hard axis field used to destabilize the magnetization of the free layer 106. Such an embodiment of the magnetic element 100 is depicted in FIG. 11. FIG. 11 is a diagram depicting an exemplary embodiment of a magnetic element 250 switchable using a magnetic field generated by layers within the magnetic element 250.

The magnetic element 250 includes first pinned layer 252, first spacer layer 254, free layer 256, second spacer layer 258, and second pinned layer 260 that correspond to the layers 102, 104, 106, 108, and 110, respectively of the magnetic element 100 of FIG. 2. Referring back to FIG. 11, also shown are AFM layers 251 and 262 that act as pinning layers for the pinned layers 252 and 260, respectively. In addition, capping layer 264 is also depicted. The magnetic element 250 also may include seed layer(s) (not shown) under the magnetic AFM layer 251 and residing on an underlying substrate (not shown). Although AFM layers 251 and 262 are shown, the AFM layers may be omitted and another mechanism used to pin the magnetizations 253 and 261 of the pinned layers 252 and 260, respectively.

The spacer layers 254 and 258 are nonmagnetic. In one embodiment, one or both of the spacer layers 254 and 208 are conductive. One or both of the spacer layers 254 and 258 may be a barrier layer, for example an insulating tunneling barrier layer. Alternatively, one or both of the spacer layers 254 and 258 may have another structure, for example a granular layer including conductive channels in an insulating matrix. However, in a preferred embodiment, the spacer layers 254 and 258 are both insulating tunneling barrier layers.

The free layer 256 is ferromagnetic and includes at least one of Co, Ni, and Fe. Although depicted as a simple layer, the free layer 256 may be a synthetic layer including multiple (e.g. two) ferromagnetic layers separated by a nonmagnetic spacer layer(s), such as Ru. The equilibrium position of the magnetization 257 of the free layer 256 is along the easy axis (not separately shown in FIG. 11). Thus, the equilibrium position of the magnetization 257 is parallel or antiparallel to the magnetization 271 of the ferromagnetic layer 270 of the pinned layer 252.

The pinned layer 252 and the 260 are preferably synthetic layers. Thus, the pinned layer 252 includes ferromagnetic layers 266 and 270 antiferromagnetically coupled through a thin nonmagnetic layer 268, such as Ru. Similarly, the pinned layer 260 includes ferromagnetic layers 272 and 276 antiferromagnetically coupled through a thin nonmagnetic layer 274, such as Ru. The pinned layers 252 and 260 are configured such that there is approximately zero net magnetic field due to the pinned layer 252 and/or 260 at the free layer 256 when no current is driven through the magnetic element 250 and such that a magnetic field is applied by the pinned layer 252 and/or 260 when a write current is driven through the magnetic element. In a preferred embodiment, a hard axis field is applied. Consequently, the pinned layer 260 preferably provides a magnetic field at the free layer 256 only when a write current is driven through the magnetic element 250, while the pinned layer 252 provides a relatively constant, and preferably zero, magnetic field at the free layer 256. Consequently, the magnetic element 250 is described in such a context.

The ferromagnetic layers 266 and 270 are configured such that the pinned layer 252 provides a substantially zero net magnetostatic field at room temperature at the free layer 256. The ferromagnetic layers 266 and 270 have their magnetizations 267 and 271, respectively, antiferromagnetically coupled. In addition, the magnetic moments and thicknesses of the ferromagnetic layers 266 and 270 are selected such that the magnetizations 267 and 271, respectively, are close enough in magnitude that the magnetostatic fields from the magnetizations 267 and 271 approximately cancel at the free layer 256 at room temperature.

Similarly, the ferromagnetic layers 272 and 276 are configured such that the pinned layer 260 provides a substantially zero net magnetostatic field at room temperature at the free layer 256. However, the pinned layer 260 is also configured to provide a net field at higher temperatures. The materials, magnetic moments, and thicknesses of the ferromagnetic layers 272 and 276 are preferably selected such that the magnetic field from the ferromagnetic layers 272 and 276 cancel at the free layer 256 at room temperature. Furthermore, the materials for the ferromagnetic layers 272 and 276 are selected such that one of the ferromagnetic layers 272 and 276 has a low Curie temperature. In one embodiment, the layer 276 has the low Curie temperature. Consequently, the magnetic element 250 is described in this context. A low Curie temperature is one which may be obtained in the layer 276 when a write current is driven through the magnetic element 250, but not at room temperature. In one embodiment, the low Curie temperature is at least one hundred degrees Celsius and not more than four hundred degrees Celsius, or even at least one hundred and not more than three hundred degrees Celsius.

In operation, at room temperature, the magnetostatic field experienced by the free layer 256 due to the magnetization 273 of the ferromagnetic layer 272 is opposite to the magnetostatic field due to the magnetization 277 of the ferromagnetic layer 276. Similarly, the magnetostatic field experienced by the free layer 256 due to the magnetization 267 of the ferromagnetic layer 266 is opposite to the magnetostatic field due to the magnetization 271 of the ferromagnetic layer 268. Thus, the free layer 256 experiences little or no net magnetostatic field at room temperature, when no write current is applied.

The application of a write current provides spin transfer torque used to write the state, AP or P, to the magnetic element 250. Consequently, the write current may be bidirectional. In addition, the write current generates joule heating. This joule heating causes temperature increase in the magnetic element 250. For the magnetic element 250, temperature increase can be quite large, on the order of a few hundred degrees Celsius. The increase in temperature of the magnetic element 250 decreases the magnetization 277 of the ferromagnetic layer 276 having the low Curie temperature much more strongly than the magnetizations 267, 271, and 273 of the remaining ferromagnetic layers 266, 270, and 272. The magnetization 273 of the ferromagnetic layer 272 may no longer be balanced by the magnetization 277 of the ferromagnetic layer 276. As a result, the net magnetostatic field experienced by the free layer 256 due to the pinned layer 260 is no longer zero. This field is directed along the hard axis of the free layer 256 and helps to destabilize the magnetization of the free layer 256. Consequently, the write current required for switching the state of the magnetic element 250 is reduced. When the write current is turned off, the pinned layer 260 temperature decreases to room temperature, causing an increase in magnetization of the ferromagnetic layer 276. Thus, the net magnetostatic field in the free layer 256 returns to close to zero, restoring thermal stability factor of the free layer.

Thus, the magnetic element 250 utilizes a hard axis field to facilitate spin transfer based switching. This is accomplished without requiring a separate current line to generate the field. Instead, a layer 272 within the magnetic element 250 is used. Issues such as a more complex structure and increased power consumption may be reduced or eliminated. Moreover, the half-select problem, which relates to disturbances in the state of cells along a current line and may result in data loss, may be reduced or eliminated. Because an internal layer 272 is used to generate the hard axis field, the magnetostatic field experienced by the other non-selected cells (not shown) is very small. Stated differently, because the distance between the neighboring cells (approximately hundred of nanometers) is much greater than the distance from the ferromagnetic layer 272 to the free layer 256, neighboring cells remain substantially unaffected. Moreover, switching may be achieved at current ranges from twenty microamps through five milliamps, or twenty to five hundred microamp. Thus, spin transfer based switching may be accomplished at a lower write current without affecting neighboring cells. Furthermore, the magnetic element 250 may have decreased magnetoresistance cancellation as compared to conventional dual structure with antiparallel orientation of pinned layer magnetizations. As described above for the magnetic elements 100, 150, and 200, a higher signal may, therefore, result.

Figure 12:
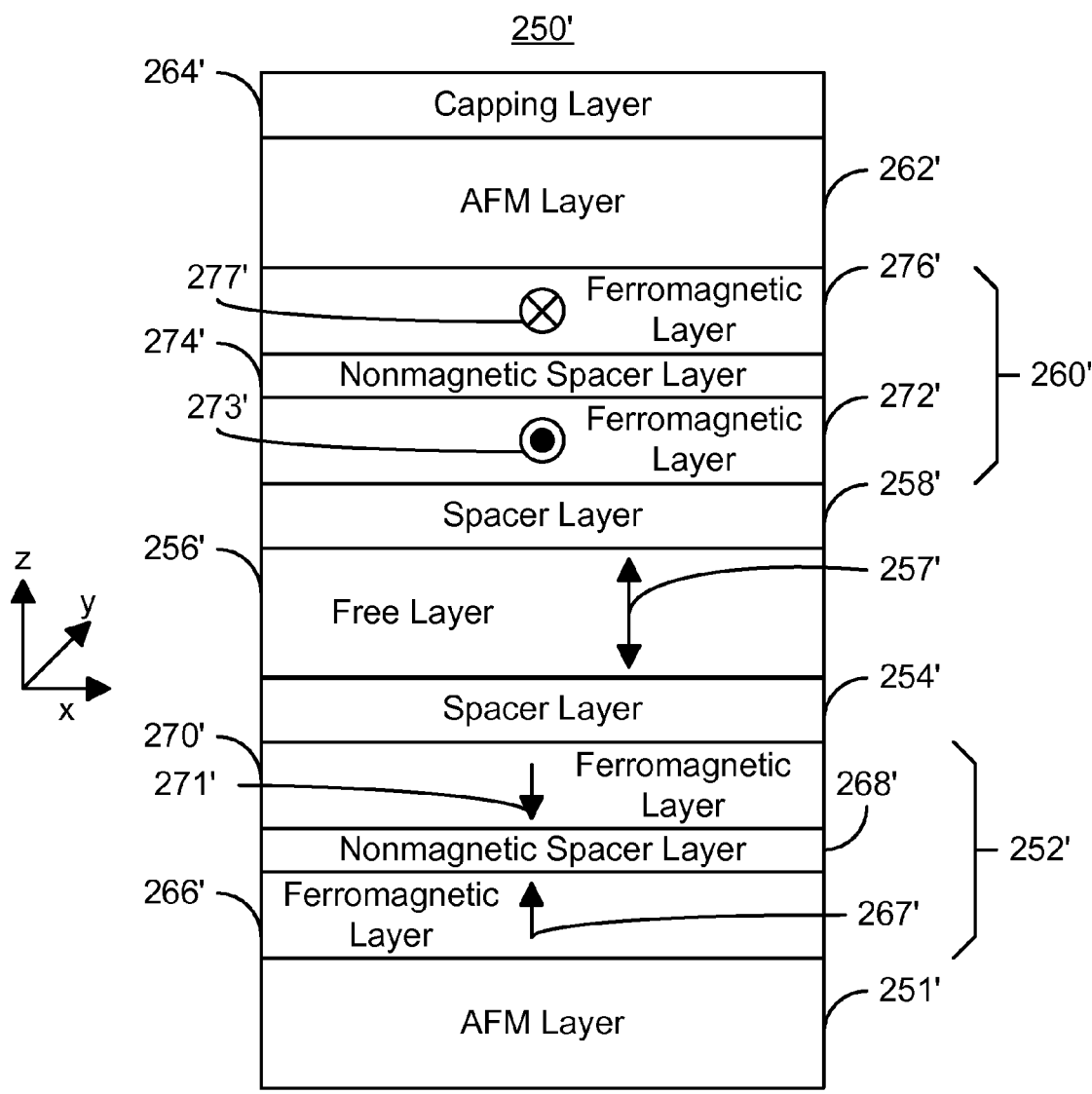
FIG. 12 is a diagram depicting another exemplary embodiment of a magnetic element switchable using a current with a magnetic field generated by the magnetic element assisting the switching.

FIG. 12 is a diagram depicting another exemplary embodiment of a magnetic element 250' switchable with a magnetic field generated by the magnetic element. The magnetic element 250' is analogous to the magnetic element 250. Consequently, the magnetic element 250' includes similar components having analogous labels. Consequently, pinned layer 252' and 260', spacer layers 254' and 258' that are preferably tunneling barrier layers, pinned layers 252' and 260', pinning layers 251' and 262' are shown. The pinned layers 252' and 260' are preferably synthetic structures, while the free layer 256' may be a single ferromagnetic layer. However, other configurations are possible. In addition, the magnetic element 250' is configured to be written in a manner analogous to the magnetic element 250. Thus, a hard axis field may be applied by the pinned layer 260' to facilitate spin transfer based switching of the free layer 256' using a bidirectional write current. However, instead of the magnetizations 267', 271', and 257' lying in plane, they are substantially perpendicular to the plane of the layers in the magnetic element 250'.

The ferromagnetic layers 266' and 270' are preferably antiferromagnetically coupled, as are the ferromagnetic layers 272' and 276'. The thicknesses of the ferromagnetic layers 266' and 270' are chosen such that the net magnetostatic field experienced by free layer 256' due to the pinned layers 252' is substantially zero. In this embodiment 250', the free layer 256' has a substantially perpendicular anisotropy in at least some regions, and in one embodiment, throughout the whole layer 256'. This anisotropy might be achieved through surface anisotropy and/or the effects of magnetoelastic anisotropy. For example, the free layer 256' may be single layer composed of ferromagnetic materials, which preferably include Co, Ni, Fe, their alloys, or CoX, CoFeX, or CoNiFeX with X=Cu, B, Ta, Ru, Re, Rh, Pt, and Pd. Alternatively, the free layer 256' might be a combination of two or more layers, including rare earth-transition metal alloy layers alternating with ferromagnetic layers. The rare earth transition metal alloy layer may be GdFe, GdCoFe. The rare-earth transition metal layers create a perpendicular anisotropy in the free layer. The pinned layer 260' includes ferromagnetic layers 272' and 276', having magnetization 273' and 277', respectively. The magnetization 277' of the ferromagnetic layer 276' is pinned in the plane of the free layer 256' and substantially perpendicular to the direction of the magnetizations 267', 271', and 257'. Thus, although the magnetizations 273' and 277' are depicted in the y direction, another direction substantially in the x-y plane may also be used. Generally, this pinning is achieved through an exchange bias with the AFM layer 262'. The thicknesses and magnetic moments of the two ferromagnetic layers 272' and 276' are chosen such that the net magnetostatic field experienced by the free layer 256' due to the pinned layer 260' is substantially zero at room temperature. Thus, the free layer 256' preferably experiences substantially no net field due to the pinned layers 252' and 260' at room temperature and with no write current driven through the magnetic element 250'. In addition, the material(s) for at least one of the ferromagnetic layers 266', 270', 272', 276', for example the ferromagnetic layer 276', is chosen to have low Curie temperature, as defined above.

The magnetic element 250' functions in an analogous manner to the magnetic element 250. At room temperature, the magnetostatic field experienced by the free layer 256' due to the magnetization 273' of the ferromagnetic layer 272' is opposite to the magnetostatic field due to the magnetization 277' of the ferromagnetic layer 276'. Similarly, the magnetostatic field experienced by the free layer 256' due to the magnetization 267' of the ferromagnetic layer 266' is opposite to the magnetostatic field due to the magnetization 271' of the ferromagnetic layer 268'. Thus, the free layer 256' experiences little or no net magnetostatic field at room temperature, when no write current is applied.

The application of a bidirectional write current provides spin transfer torque used to write the state, AP or P, of the magnetic element 250'. In addition, the write current generates joule heating. This joule heating causes temperature increase in the magnetic element 250'. The increase in temperature of the magnetic element 250' decreases the magnetization 277' of the ferromagnetic layer 276' having the low Curie temperature much more strongly than the magnetizations 267', 271', and 273' of the remaining ferromagnetic layers 266', 270', and 272'. The magnetization 273' of the ferromagnetic layer 272' may no longer be balanced by the magnetization 277' of the ferromagnetic layer 276'. As a result, the net magnetostatic field experienced by the free layer 256' due to the pinned layer 260' is no longer zero. This field is directed along the hard axis of the free layer 256' and helps to destabilize the magnetization of the free layer 256'. Consequently, the write current required for switching the state of the magnetic element 250' is reduced. When the write current is turned off, the pinned layer 260' temperature decreases to room temperature, causing increase in magnetization of the ferromagnetic layer 276'. Thus, the net magnetostatic field in the free layer 256' returns to close to zero, restoring thermal stability factor of the free layer.

Thus, the magnetic element 250' utilizes a hard axis field to facilitate spin transfer based switching. The magnetic element 250' thus shares many of the benefits of the magnetic element 250. Consequently, a lower write current may be used without substantially increasing the complexity and power consumption of the memory or suffering from the half select problem. Furthermore, the magnetic element 250' may have decreased magnetoresistance cancellation as compared to conventional dual structure with antiparallel orientation of pinned layer magnetizations. As described above for the magnetic elements 100, 150, and 200, a higher signal may, therefore, result.

Figure 13:
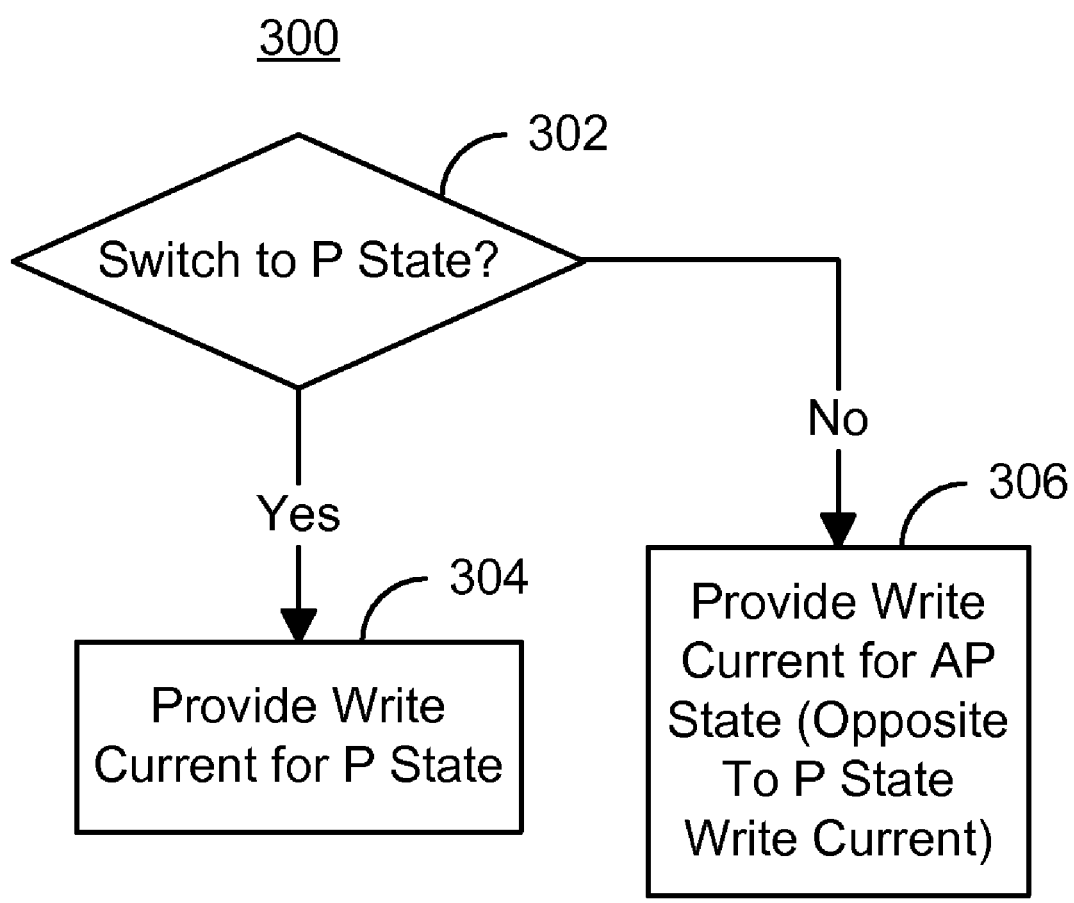
FIG. 13 is a diagram depicting another exemplary embodiment of a method for switching magnetic element.

FIG. 13 is a diagram depicting an exemplary embodiment of a method 300 for switching magnetic element 100/250/250' when the unidirectional current is used. For clarity, the method 300 is described in the context of the magnetic element 250. However, the method 300 may be used with other structures. It is determined whether the P state or AP state is to be written, via step 302. If the P state is desired, a bidirectional current is applied in the CPP orientation such that the free layer 256 should align parallel to the pinned layer magnetization 271, via step 304. Thus, current is driven downward in FIG. 11. Application of the current causes joule heating in the magnetic element 250 and, therefore, a hard axis field to be generated by the ferromagnetic layer 272. The hard axis field destabilizes the magnetization of the free layer 257. The magnetic element 250 may thus be switched to P state using a lower current. If the magnetic element 250 is not to be switched to the parallel state, then the magnetic element 250 is switched to the antiparallel state. This is accomplished by providing a write current in the CPP orientation such that the free layer magnetization 257 aligns antiparallel to the pinned layer 271. Thus, current is driven upward in FIG. 11. Application of the current causes joule heating in the magnetic element 250 and, therefore, a hard axis field to be generated by the pinned layer 272. The hard axis field destabilizes the magnetization of the free layer 257. The magnetic element 250 may thus be switched to P state using a lower current.

Because a lower unidirectional current is used, the strict requirements on the maximum value of the current passed through the magnetic element 250 may be alleviated. In addition, cancellation of the tunneling magnetoresistance during reading may be reduced, as compared to conventional dual structure, which has opposite direction of the pinned layer magnetizations. Thus, the method may provide improved switching and a higher signal.

A method and system for providing a magnetic memory element has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic element comprising:
   a first pinned layer having a first magnetization oriented in a first direction;
   a first spacer layer, the first spacer layer being nonferromagnetic; and
   a free layer, the first spacer layer residing between the first pinned layer and the free layer;
   a second spacer layer, the second spacer layer being non-ferromagnetic, the free layer being between the first spacer layer and the second spacer layer; and
   a second pinned layer having a second magnetization oriented in a second direction substantially perpendicular to the first direction;
   wherein at least one of the magnetic element is configured to allow the free layer to be switched to each of a plurality of states when both a unidirectional write current is passed through the magnetic element and the magnetic element is subjected to a magnetic field corresponding to the each of the plurality of states and the magnetic element is configured to allow the free layer to be switched to each of the plurality of states utilizing a write current and an additional magnetic field that is applied from at least one of the first pinned layer and the second pinned layer substantially only if the write current is also applied.

2. The magnetic element of claim 1 wherein the first pinned layer is a synthetic pinned layer including a first ferromagnetic layer, a second ferromagnetic layer, and a nonmagnetic spacer layer between the first ferromagnetic layer and the second ferromagnetic layer.

3. The magnetic element of claim 2 wherein the first ferromagnetic layer generates a first field substantially at the free layer, the second ferromagnetic layer generates a second field substantially at the free layer, the first field and the second field being substantially equal and opposite in direction.

4. The magnetic element of claim 1 wherein the second pinned layer is a synthetic pinned layer including a first ferromagnetic layer, a second ferromagnetic layer, and a nonmagnetic spacer layer between the first ferromagnetic layer and the second ferromagnetic layer.

5. The magnetic element of claim 4 wherein the first ferromagnetic layer generates a first field substantially at the free layer, the second ferromagnetic layer generates a second field substantially at the free layer, the first field and the second field being substantially equal and opposite in direction.

6. The magnetic element of claim 1 wherein the free layer is a synthetic free layer including a first ferromagnetic layer, a second ferromagnetic layer, and a nonmagnetic spacer layer between the first ferromagnetic layer and the second ferromagnetic layer.

7. The magnetic element of claim 1 wherein the second direction is substantially normal to a free layer plane and if the unidirectional current is used, then the magnetic field is along a free layer easy axis.

8. The magnetic element of claim 1 wherein the magnetic element is configured to allow the free layer to be switched to the each of the plurality of states when both the unidirectional write current is passed through the magnetic element and the magnetic element is subjected to the magnetic field corresponding to the each of the plurality of states.

9. The magnetic element of claim 8 wherein at least one additional current is used to generate the magnetic field.

10. The magnetic element of claim 1 the first pinned layer and the second pinned layer are configured such that the additional magnetic field is applied from at least one of the first pinned layer and the second pinned layer substantially only if the write current is also applied.

11. The magnetic element of claim 10 wherein the first pinned layer includes a first ferromagnetic layer, a second ferromagnetic layer, and a first nonmagnetic spacer layer between the first ferromagnetic layer and the second ferromagnetic layer, the first ferromagnetic layer having a first magnetization oriented in a first direction;
   wherein the second pinned layer including a third ferromagnetic layer, a fourth ferromagnetic layer, and a second nonmagnetic spacer layer between the third ferromagnetic layer and the fourth ferromagnetic layer, the third ferromagnetic layer having a second magnetization oriented in a second direction substantially perpendicular to the first direction;
   wherein the first ferromagnetic layer generates a first field substantially at the free layer, the second ferromagnetic layer generates a second field substantially at the free layer, the first field and the second field being substantially equal and opposite in direction;
   wherein the third ferromagnetic layer generates a third field substantially at the free layer, the fourth ferromagnetic layer generates a fourth field substantially at the free layer, the third field and the fourth field being substantially equal and opposite in direction; and
   wherein one of the first ferromagnetic layer, the second ferromagnetic layer, the third layer, and the fourth ferromagnetic layer has a low Curie temperature.

12. The magnetic element of claim 11 wherein the first layer has the low Curie temperature.

13. The magnetic element of claim 11 wherein the fourth layer has the low Curie temperature.

14. The magnetic element of claim 11 wherein the Curie temperature is not more than four hundred degrees Celsius.

15. The magnetic element of claim 11 wherein the second direction is substantially normal to a free layer plane and if the unidirectional current is used, then the magnetic field is along a free layer easy axis.

16. A magnetic memory comprising:
   a plurality of magnetic storage cells, each of the plurality of magnetic storage cells including at least one magnetic element, the at least one magnetic element including a first pinned layer, a first spacer layer, a free layer, a second spacer layer, and a second pinned layer, the first pinned layer having a first magnetization oriented in a first direction, a first spacer layer being nonferromagnetic and residing between the free layer and the pinned layer, the second spacer layer being nonferromagnetic and residing between the free layer and the second pinned layer, the second pinned layer having a second magnetization oriented in a second direction substantially perpendicular to the first direction;
   a plurality of word lines coupled with the plurality of magnetic storage cells; and
   a plurality of bit lines coupled with the plurality of storage cells;
   wherein at least one of the magnetic element is configured to allow the free layer to be switched to each of a plurality of states when both a unidirectional write current is passed through the magnetic element and the magnetic element is subjected to a magnetic field corresponding to the each of the plurality of states and the first pinned layer and the second pinned layer are configured such that an additional magnetic field is applied from at least one of the first pinned layer and the second pinned layer substantially only if a write current is also applied.

17. The magnetic memory of claim 16 wherein the plurality of bit lines are oriented substantially perpendicular to the plurality of word lines.

18. The magnetic memory of claim 17 wherein the free layer has an easy axis oriented substantially forty-five degrees from the plurality of bit lines and the plurality of word lines.

19. The magnetic memory of claim 16 wherein the magnetic memory is configured to provide current in a first direction through a portion of the plurality of word lines when writing to a first of the plurality of states and in a second direction through a portion of the plurality of word lines when writing to a second of the plurality of states.

20. The magnetic memory of claim 16 wherein the first pinned layer is a synthetic pinned layer including a first ferromagnetic layer, a second ferromagnetic layer, and a nonmagnetic spacer layer between the first ferromagnetic layer and the second ferromagnetic layer.

21. The magnetic memory of claim 20 wherein the first ferromagnetic layer generates a first field substantially at the free layer, the second ferromagnetic layer generates a second field substantially at the free layer, the first field and the second field being substantially equal and opposite in direction.

22. The magnetic memory of claim 16 wherein the second pinned layer is a synthetic pinned layer including a first ferromagnetic layer, a second ferromagnetic layer, and a nonmagnetic spacer layer between the first ferromagnetic layer and the second ferromagnetic layer.

23. The magnetic memory of claim 22 wherein the first ferromagnetic layer generates a first field substantially at the free layer, the second ferromagnetic layer generates a second field substantially at the free layer, the first field and the second field being substantially equal and opposite in direction.

24. The magnetic memory of claim 16 wherein the free layer is a synthetic free layer including a first ferromagnetic layer, a second ferromagnetic layer, and a nonmagnetic spacer layer between the first ferromagnetic layer and the second ferromagnetic layer.

25. The magnetic memory of claim 16 wherein the second direction is substantially normal to a free layer plane and if the unidirectional current is used, then the magnetic field is along a free layer easy axis.

26. The magnetic memory of claim 16 wherein the magnetic element is configured to allow the free layer to be switched to the each of the plurality of states when both the unidirectional write current is passed through the magnetic element and the magnetic element is subjected to the magnetic field corresponding to the each of the plurality of states.

27. The magnetic memory of claim 26 wherein at least one additional current is used to generate the magnetic field.

28. The magnetic memory of claim 16 the first pinned layer and the second pinned layer are configured such that the additional magnetic field is applied from at least one of the first pinned layer and the second pinned layer substantially only if the write current is also applied.

29. The magnetic memory of claim 28 wherein the first pinned layer includes a first ferromagnetic layer, a second ferromagnetic layer, and a first nonmagnetic spacer layer between the first ferromagnetic layer and the second ferromagnetic layer, the first ferromagnetic layer having a first magnetization oriented in a first direction;

wherein the second pinned layer including a third ferromagnetic layer, a fourth ferromagnetic layer, and a second nonmagnetic spacer layer between the third ferromagnetic layer and the fourth ferromagnetic layer, the third ferromagnetic layer having a second magnetization oriented in a second direction substantially perpendicular to the first direction;

wherein the first ferromagnetic layer generates a first field substantially at the free layer, the second ferromagnetic layer generates a second field substantially at the free layer, the first field and the second field being substantially equal and opposite in direction;

wherein the third ferromagnetic layer generates a third field substantially at the free layer, the fourth ferromagnetic layer generates a fourth field substantially at the free layer, the third field and the fourth field being substantially equal and opposite in direction; and wherein one of the first ferromagnetic layer, the second ferromagnetic layer, the third layer, and the fourth ferromagnetic layer has a low Curie temperature.

30. The magnetic memory of claim 29 wherein the first layer has the low Curie temperature.

31. The magnetic memory of claim 29 wherein the fourth layer has the low Curie temperature.

32. The magnetic memory of claim 29 wherein the Curie temperature is not more than four hundred degrees Celsius.

33. The magnetic memory of claim 29 wherein the second direction is substantially normal to a free layer plane and if the unidirectional current is used, then the magnetic field is along a free layer easy axis.

34. A magnetic element comprising:
a first pinned layer having a first magnetization oriented in a first direction;
a first spacer layer, the first spacer layer being nonferromagnetic; and
a free layer, the first spacer layer residing between the first pinned layer and the free layer;
a second spacer layer, the second spacer layer being nonferromagnetic, the free layer being between the first spacer layer and the second spacer layer; and
a second pinned layer having a second magnetization oriented in a second direction substantially perpendicular to the first direction;
wherein at least one of the magnetic element is configured to allow the free layer to be switched to each of a plurality of states when both a unidirectional write current is passed through the magnetic element and the magnetic element is subjected to a magnetic field corresponding to the each of the plurality of states and the first pinned layer and the second pinned layer are configured such that an additional magnetic field is applied from at least one of the first pinned layer and the second pinned layer substantially only if a write current is also applied.

35. A method of programming a magnetic element comprising:
driving a current through the magnetic element in a first direction if the magnetic element is to be written to a first state or to a second state;
applying a first magnetic field to the magnetic element if the magnetic element is to be written to the first state, the first magnetic field having substantially a first direction substantially at the magnetic element;
applying a second magnetic field to the magnetic element if the magnetic element is to be written to the second state, the first magnetic field having substantially a second direction substantially at the magnetic element.

36. The method of claim 35 wherein magnetic element includes a first pinned layer, a first spacer layer, a free layer, a second spacer layer, and a second pinned layer, the first pinned layer having a first magnetization oriented in a first direction, a first spacer layer being nonferromagnetic and residing between the free layer and the pinned layer, the second spacer layer being nonferromagnetic and residing between the free layer and the second pinned layer, the second pinned layer having a second magnetization oriented in a second direction substantially perpendicular to the first direction.

37. The method of claim 36 wherein the first magnetic field applying further includes:
   driving the current through a bit line in a first current direction.

38. The method of claim 37 wherein the second magnetic field applying further includes:
   driving the current through the bit line in a second current direction substantially opposite to the first direction.

39. The method of claim 36 wherein the first pinned layer is a synthetic pinned layer including a first ferromagnetic layer, a second ferromagnetic layer, and a nonmagnetic spacer layer between the first ferromagnetic layer and the second ferromagnetic layer.

40. The method of claim 39 wherein the first ferromagnetic layer generates a first field substantially at the free layer, the second ferromagnetic layer generates a second field substantially at the free layer, the first field and the second field being substantially equal and opposite in direction.

41. The method of claim 40 wherein the first ferromagnetic layer has a low Curie temperature.

42. The method of claim 41 wherein the low Curie temperature is not more than four hundred degrees Celsius.

43. The method of claim 42 wherein the low Curie temperature is at least one hundred degrees Celsius.

44. The method of claim 36 wherein the second pinned layer is a synthetic pinned layer including a first ferromagnetic layer, a second ferromagnetic layer, and a nonmagnetic spacer layer between the first ferromagnetic layer and the second ferromagnetic layer.

45. The method of claim 44 wherein the first ferromagnetic layer generates a first field substantially at the free layer, the second ferromagnetic layer generates a second field substantially at the free layer, the first field and the second field being substantially equal and opposite in direction.

46. The method of claim 36 wherein the free layer is a synthetic free layer including a first ferromagnetic layer, a second ferromagnetic layer, and a nonmagnetic spacer layer between the first ferromagnetic layer and the second ferromagnetic layer.

47. The method of claim 36 wherein the second direction is substantially normal to a free layer plane and if the unidirectional current is used, then the magnetic field is along a free layer easy axis.

48. The method of claim 36 wherein the first pinned layer includes a first ferromagnetic layer, a second ferromagnetic layer, and a first nonmagnetic spacer layer between the first ferromagnetic layer and the second ferromagnetic layer, the first ferromagnetic layer having a first magnetization oriented in a first direction;
   wherein the second pinned layer including a third ferromagnetic layer, a fourth ferromagnetic layer, and a second nonmagnetic spacer layer between the third ferromagnetic layer and the fourth ferromagnetic layer, the third ferromagnetic layer having a second magnetization oriented in a second direction substantially perpendicular to the first direction;
   wherein the first ferromagnetic layer generates a first field substantially at the free layer, the second ferromagnetic layer generates a second field substantially at the free layer, the first field and the second field being substantially equal and opposite in direction;
   wherein the third ferromagnetic layer generates a third field substantially at the free layer, the fourth ferromagnetic layer generates a fourth field substantially at the free layer, the third field and the fourth field being substantially equal and opposite in direction; and
   wherein one of the first ferromagnetic layer, the second ferromagnetic layer, the third layer, and the fourth ferromagnetic layer has a low Curie temperature.

49. The method of claim 48 wherein the first layer has the low Curie temperature.

50. The method of claim 48 wherein the fourth layer has the low Curie temperature.

51. The method of claim 48 wherein the Curie temperature is not more than four hundred degrees Celsius.

52. The method of claim 48 wherein the second direction is substantially normal to a free layer plane and if the unidirectional current is used, then the magnetic field is along a free layer easy axis.

* * * * *